(12) United States Patent
Yamaguchi et al.

(10) Patent No.: US 8,759,806 B2
(45) Date of Patent: Jun. 24, 2014

(54) SEMICONDUCTOR MEMORY DEVICE

(75) Inventors: Takeshi Yamaguchi, Kawasaki (JP); Hirofumi Inoue, Kamakura (JP); Reika Ichihara, Yokohama (JP); Takayuki Tsukamoto, Yokkaichi (JP); Takashi Shigeoka, Fujisawa (JP); Katsuyuki Sekine, Yokkaichi (JP); Shinya Aoki, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/182,095

(22) Filed: Jul. 13, 2011

(65) Prior Publication Data

US 2012/0012807 A1 Jan. 19, 2012

(30) Foreign Application Priority Data

Jul. 16, 2010 (JP) ................. 2010-161424

(51) Int. Cl.
*H01L 29/02* (2006.01)
(52) U.S. Cl.
USPC ............... 257/2; 257/4; 257/43; 257/E45.002
(58) Field of Classification Search
USPC ......... 257/4, 43, E45.003, E45.002, E21.078, 257/E45.001, 5, 2; 438/104
See application file for complete search history.

(56) References Cited

U.S. PATENT DOCUMENTS 8,183,553 B2 * 5/2012 Phatak et al. ...................... 257/4
8,350,245 B2 1/2013 Tsuji 2009/0020740 A1 * 1/2009 Chien et al. ...................... 257/2
2010/0238702 A1 * 9/2010 Yamaguchi et al. ........... 365/148
2011/0031459 A1 2/2011 Kubo et al.
2011/0297927 A1 * 12/2011 Ramaswamy et al. .......... 257/43

FOREIGN PATENT DOCUMENTS

| WO | WO 2008/075471 A | 6/2008 |
|----|-------------------|--------|
| WO | WO 2010/004705 A | 1/2010 |
| WO | WO 2010004705 A1 * | 1/2010 |
| WO | WO 2010/067585 A | 6/2010 |
| WO | WO 2010067585 A1 * | 6/2010 |
| WO | WO 2011071009 A1 * | 6/2011 |

OTHER PUBLICATIONS

U.S. Appl. No. 13/043,097, dated Mar. 8, 2011, Yamaguchi et al.
H. Y. Lee, "Low Power and High Speed Bipolar Switching with a Thin Reactive Ti Buffer Layer in Robust HfO$_2$ Based RRAM", IEDM Tech. Dig., IEEE, 2008, 4 pages.

(Continued)

*Primary Examiner* — Samuel Gebremariam
*Assistant Examiner* — Lauren R Bell
(74) *Attorney, Agent, or Firm* — Oblon, Spivak, McClelland, Maier & Neustadt, L.L.P.

(57) ABSTRACT

A semiconductor memory device in an embodiment comprises memory cells, each of the memory cells disposed between a first line and a second line and having a variable resistance element and a switching element connected in series. The variable resistance element includes a variable resistance layer configured to change in resistance value thereof between a low-resistance state and a high-resistance state. The variable resistance layer is configured by a transition metal oxide. A ratio of transition metal and oxygen configuring the transition metal oxide varies between 1:1 and 1:2 along a first direction directed from the first line to the second line.

19 Claims, 7 Drawing Sheets

First Example

Example

(56) References Cited

OTHER PUBLICATIONS

C. Y. Lin, "Modified resistive switching behavior of $ZrO_2$ memory films based on the interface layer formed by using Ti top electrode", Journal of Applied Physics 102, 094101, American Institute of Physics, 2007, 5 pages.

U.S. Appl. No. 13/601,494, dated Aug. 31, 2012, Fukumizu et al.
Office Action issued Jul. 2, 2013 in corresponding Japanese Patent Application No. 2010-161424 (with English translation).
Japanese Office Action issued Sep. 24, 2013 in Patent Application No. 2010-161424 with English Translation.

* cited by examiner

First Example

Second Example

Third Example

Fourth Example

Fifth Example

Sixth Example

Seventh Example

SEMICONDUCTOR MEMORY DEVICE

CROSS-REFERENCE TO RELATED APPLICATIONS

This application is based upon and claims the benefit of priority from the prior Japanese Patent Application No. 2010-161424, filed on Jul. 16, 2010, the entire contents of which are incorporated herein by reference.

FIELD

The embodiments described in the present specification relate to a semiconductor memory device having memory cells arranged therein, each of the memory cells including a variable resistance element and being configured to store data by a change in resistance value of the variable resistance element.

BACKGROUND

In recent years, along with a rising level of integration in semiconductor devices, circuit patterns of transistors and so on configuring these semiconductor devices are being increasingly miniaturized. Required in this miniaturization of the patterns is not simply a thinning of line width but also an improvement in dimensional accuracy and positioning accuracy of the patterns. This trend applies also to semiconductor memory devices.

Conventionally known and marketed semiconductor memory devices such as DRAM, SRAM, and flash memory each use a MOSFET as a memory cell. These semiconductor memory devices require, along with miniaturization of the patterns, an improvement in dimensional accuracy and positioning accuracy at a rate that exceeds a rate of the miniaturization. As a result, a large burden is placed also on the lithography technology for forming these patterns which is a factor contributing to a rise in product cost.

Furthermore, resistance variable memory is attracting attention as a candidate to succeed such semiconductor memory devices employing a MOSFET as a memory cell. The resistance variable memory herein includes not only ReRAM (Resistive RAM) but also phase change memory (PCRAM: Phase Change RAM). The ReRAM uses a transition metal oxide as a recording layer to store a resistance state of the transition metal oxide in a nonvolatile manner. The phase change memory (PCRAM) uses chalcogenide or the like as a recording layer to utilize resistance information of a crystalline state (conductor) and an amorphous state (insulator).

Two kinds of variable resistance elements in the aforementioned resistance variable memory are known, namely a unipolar type and a bipolar type. In a bipolar type resistance variable memory, the variable resistance element is applied with a voltage pulse (write pulse, erase pulse) of different polarity for a setting operation (write) and a resetting operation (erase). On the other hand, in a unipolar type resistance variable memory, the polarity of the voltage pulse applied in the setting operation and the resetting operation is the same, and what differs between the setting operation and the resetting operation is an amplitude and time of the applied voltage pulse.

In a conventional resistance variable memory, there is a problem that during application of the erase pulse to the variable resistance element, write is mistakenly re-performed after erase has been performed (so-called incorrect write). This problem has not been sufficiently solved. In particular, in a unipolar type resistance variable memory, a difference in amplitude and time of the applied voltage between the setting operation and the resetting operation is small, and there is therefore a large risk of an incorrect write occurring after completion of the resetting operation. Even in bipolar type resistance variable memory, the risk of incorrect write has not been sufficiently reduced. Hence, there is a need for proposal of a resistance variable memory having a small risk of incorrect write.

DETAILED DESCRIPTION

A semiconductor memory device in an embodiment described below comprises memory cells, each of the memory cells disposed between a first line and a second line and including a variable resistance element and a switching element connected in series. The variable resistance element includes a variable resistance layer configured to change in resistance value thereof between a low-resistance state and a high-resistance state. The variable resistance layer is configured by a transition metal oxide. A ratio of transition metal and oxygen configuring the transition metal oxide varies between 1:1 and 1:2 along a first direction directed from the first line to the second line.

The embodiment of the semiconductor memory device in accordance with the present invention is described below with reference to the drawings.

Figure 1:
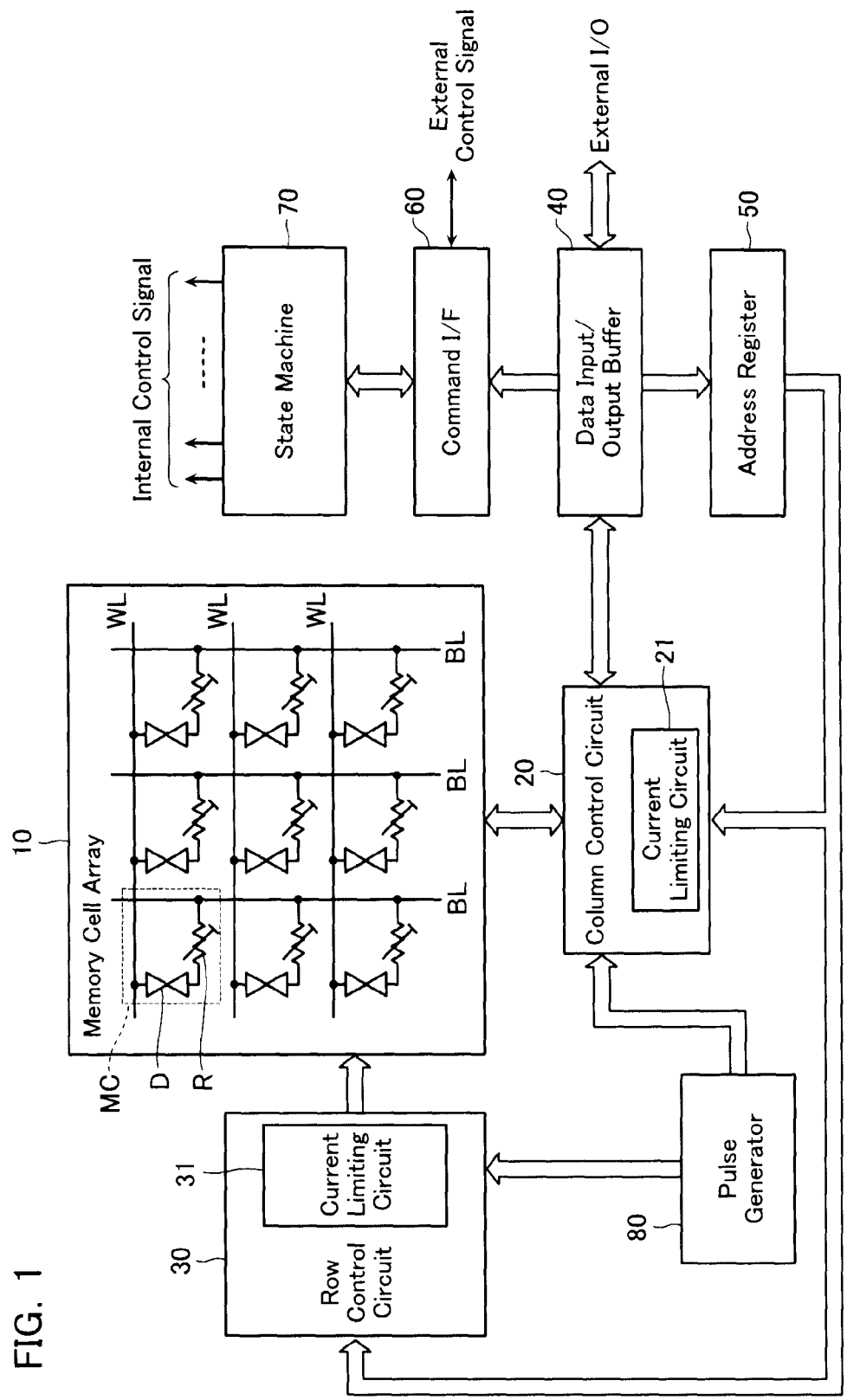
FIG. 1 is a block diagram of a semiconductor memory device in accordance with an embodiment.

FIG. 1 is a block diagram of the semiconductor memory device in accordance with the embodiment of the present invention. As shown in FIG. 1, the semiconductor memory device in accordance with the embodiment includes a memory cell array 10, a column control circuit 20, a row control circuit 30, a data input/output buffer 40, an address register 50, a command I/F 60, a state machine 70, and a pulse generator 80.

As shown in FIG. 1, the memory cell array 10 includes word lines WL and bit lines BL configured to intersect each other, and memory cells MC disposed at intersections of the word lines WL and the bit lines BL. The word lines WL are formed extending in an X direction and arranged having a certain pitch in a Y direction. The bit lines BL are formed extending in the Y direction and arranged having a certain pitch in the X direction. That is, the memory cells MC are disposed in a matrix on a surface formed by the X direction and the Y direction.

As shown in FIG. 1, each of the memory cells MC includes a bi-directional diode D and a variable resistance element R connected in series. The bi-directional diode D has one end connected to the word line WL and the other end connected to one end of the variable resistance element R. The other end of the variable resistance element R is connected to the bit line BL. The variable resistance element R is configured to have its resistance value varied and to store data in a nonvolatile manner based on the resistance value.

The bi-directional diode D is a bipolar type element configured capable of allowing a current to flow bi-directionally in the memory cell MC according to a polarity of a voltage applied to the memory cell MC.

The variable resistance element R is an element configured to shift between at least two resistance values of, for example, a low-resistance state and a high-resistance state. The variable resistance element R shifts from the high-resistance state to the low-resistance state when applied with a certain pulse voltage (write operation, setting operation). In addition, the variable resistance element R shifts from the low-resistance state to the high-resistance state when applied with a pulse voltage of a reverse polarity to the setting operation (erase operation, resetting operation).

The column control circuit 20 controls the bit lines BL of the memory cell array 10 to perform data erase of the memory cells MC (resetting operation), data write to the memory cells MC (setting operation), and data read from the memory cells MC. In addition, the column control circuit 20 includes a current limiting circuit 21. The current limiting circuit 21 limits a current flowing from the bit line BL via the memory cell MC to the word line WL.

The row control circuit 30 selects the word lines WL of the memory cell array 10 to apply a voltage required in data erase of the memory cells MC (resetting operation), data write to the memory cells MC (setting operation), and data read from the memory cells MC. In addition, the row control circuit 30 includes a current limiting circuit 31. The current limiting circuit 31 limits a current flowing from the word line WL via the memory cell MC to the bit line BL.

The data input/output buffer 40 is connected via an I/O line to an external host not shown, and is configured to receive write data, receive erase instructions, output read data, and receive address data and command data. The data input/output buffer 40 sends received write data to the column control circuit 20, and receives read data from the column control circuit 20 to be output to external.

The address register 50 sends addresses supplied to the data input/output buffer 40 from the host to the column control circuit 20 and the row control circuit 30.

The command interface 60 receives commands supplied to the data input/output buffer 40 from the host. The command interface 60 receives an external control signal from the host, judges whether data inputted to the data input/output buffer 40 is write data, a command or an address, and, if the data is a command, receives the data and transfers the data to the state machine 70 as a command signal.

The state machine 70 performs management of the nonvolatile memory overall, and receives commands from the host to perform management of read, write, erase, input/output of data, and so on. Moreover, it is also possible for the external host to receive status information managed by the status machine 70 and judge operation results. This status information may additionally be used for control of write and erase.

The pulse generator 80 is controlled by the state machine 70. This control enables the pulse generator 80 to output a pulse of any voltage and any timing. Now, the pulse formed may be transferred to any line selected by the column control circuit 20 and row control circuit 30. Note that peripheral circuit elements other than the memory cell array 10 are formable on a Si substrate directly below the memory cell array 10 formed in a wiring layer, thus enabling chip area of the nonvolatile memory to be set substantially equal to area of the memory cell array 10.

Figure 2:
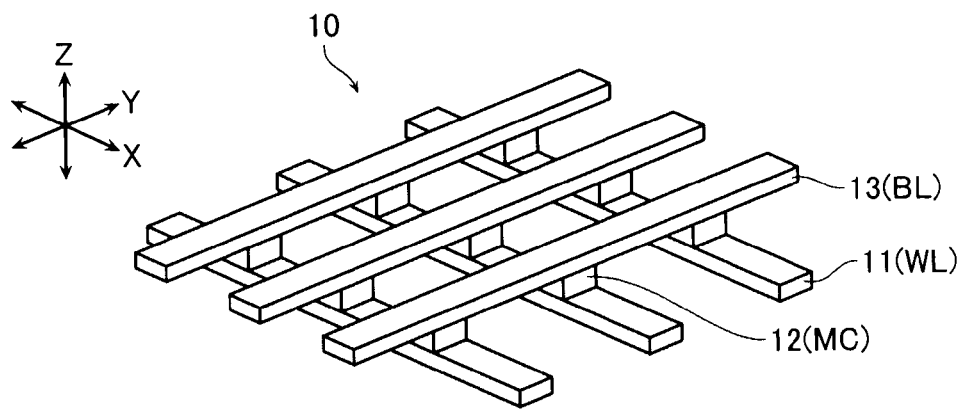
FIG. 2 is a perspective view showing a memory cell array 10.

Next, a stacking structure of the memory cell array 10 in accordance with the embodiment is described in detail with reference to FIG. 2. FIG. 2 is a perspective view showing the memory cell array 10. The memory cell array 10 is configured as a so-called cross-point type.

As shown in FIG. 2, the memory cell array 10 includes, from a lower layer to an upper layer, a first conductive layer 11, a memory layer 12, and a second conductive layer 13. The first conductive layer 11 functions as the word line WL. The memory layer 12 functions as the memory cell MC. The second conductive layer 13 functions as the bit line BL.

As shown in FIG. 2, the first conductive layer 11 is formed in stripes extending in an X direction and having a certain pitch in a Y direction. The first conductive layer 11 is preferably a heat-resistant low-resistance material, configured by any of tungsten (W), tungsten silicide (WSi), nickel silicide (NiSi), cobalt silicide (CoSi), or the like.

As shown in FIG. 2, the memory layer 12 is provided on the first conductive layer 11 and arranged in a matrix in the X direction and the Y direction.

As shown in FIG. 2, the second conductive layer 13 is formed in stripes extending in the Y direction and having a certain pitch in the X direction. The second conductive layer 13 is formed in contact with an upper surface of the memory layer 12. The second conductive layer 13 is preferably a heat-resistant low-resistance material, configured by any of tungsten (W), tungsten silicide (WSi), nickel silicide (NiSi), cobalt silicide (CoSi), or the like.

Figure 3:
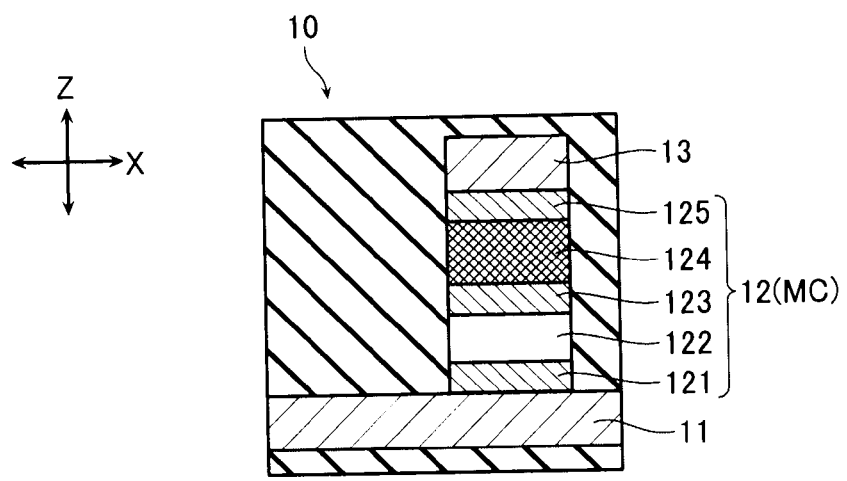
FIG. 3 is a cross-sectional view of FIG. 2.

Next, a stacking structure of the memory layer 12 is described in detail with reference to FIG. 3. FIG. 3 is a cross-sectional view of FIG. 2. As shown in FIG. 3, the memory layer 12 includes, from a lower layer to an upper layer, an electrode layer 121, a diode layer 122, an electrode layer 123, a variable resistance layer 124, and an electrode layer 125.

The electrode layer 121 is formed on an upper surface of the first conductive layer 11. The electrode layer 121 is configured by, for example, titanium (Ti) or titanium nitride (TiN$_x$). Alternatively, the electrode layer 121 is configured by, for example, tungsten (W) or tungsten nitride (WN$_x$).

The diode layer 122 is formed on an upper surface of the electrode layer 121. The diode layer 122 functions as the bi-directional diode D. The electrode layer 123 is formed on an upper surface of the diode layer 122. The electrode layer 123 is configured by a similar material to the electrode layer 121.

The variable resistance layer 124 is formed between the electrode layer 123 and the electrode layer 125. The variable resistance layer 124 functions as the variable resistance element R. That is, the variable resistance layer 124 is configured to have its resistance value changed between the low-resistance state and the high-resistance state by a voltage applied in the Z direction. The variable resistance layer 124 is configured by a transition metal oxide (for example, hafnium oxide (HfOx)). Moreover, as described in detail below, a ratio of transition metal and oxygen configuring the transition metal oxide varies between 1:1 and 1:2 along the Z direction (depth direction).

A concentration gradient of oxygen in the above-described variable resistance layer 124 allows a large operating margin to be secured and power consumption to be suppressed in the variable resistance layer 124 compared to the case where there is substantially no concentration gradient of oxygen (the case where a ratio of concentrations of transition metal and oxygen are substantially constant). Note that details of these advantages will be described later.

The electrode layer 125 is formed between the variable resistance layer 124 and the second conductive layer 13. The electrode layer 125 is configured by a similar material to the electrode layer 121.

Next, specific structures in a proximity of the variable resistance layer 124 according to first through seventh examples of the embodiment are described with reference to FIGS. 4A-4G.

Figure 4A:
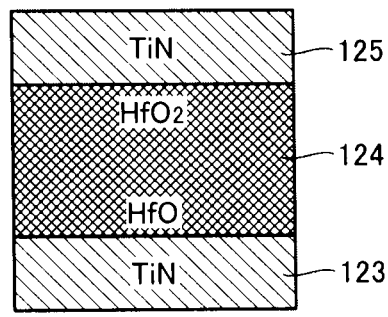
FIG. 4A is a cross-sectional view showing a specific structure in a proximity of a variable resistance layer 124 according to a first example of the embodiment.

In the first example shown in FIG. 4A, the variable resistance layer 124 is formed in contact with an upper surface of the electrode layer 123 and in contact with a lower surface of the electrode layer 125. The variable resistance layer 124 is configured by hafnium oxide (HfO$_x$). The concentration of oxygen with respect to hafnium (Hf) included in the variable resistance layer 124 lowers as the electrode layer 123 is approached and rises as the electrode layer 125 is approached. In the example shown in FIG. 4A, on a side close to the electrode layer 123, the variable resistance layer 124 is configured mainly by HfO, and on a side close to the electrode layer 125, the variable resistance layer 124 is configured mainly by HfO$_2$. The variable resistance layer 124 may be configured by a transit ion metal other than hafnium. For example, the variable resistance layer 124 may be configured by MnAlO or CoAlO.

Figure 4B:
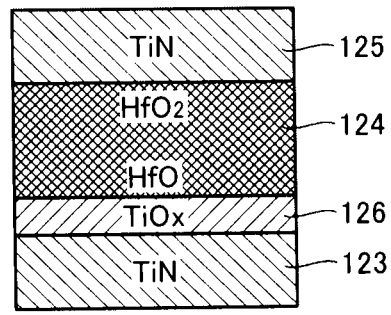
FIG. 4B is a cross-sectional view showing a specific structure in a proximity of a variable resistance layer 124 according to a second example of the embodiment.

In the second example shown in FIG. 4B, the variable resistance layer 124 is formed in contact with the lower surface of the electrode layer 125. Moreover, in the second example, the memory layer 12 includes a barrier metal layer 126 configured in contact with the upper surface of the electrode layer 123 and in contact with a lower surface of the variable resistance layer 124. The barrier metal layer 126 functions to prevent atoms included in the variable resistance layer 124 from diffusing into the electrode layer 123. The barrier metal layer 126 is configured by, for example, titanium oxide (TiO$_x$). The variable resistance layer 124 is configured by a similar material to in the first example.

Figure 4C:
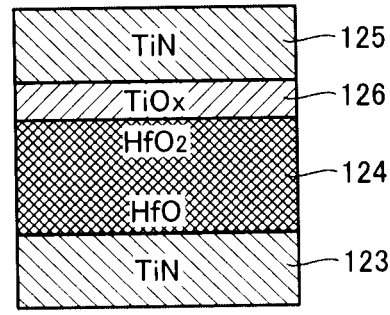
FIG. 4C is a cross-sectional view showing a specific structure in a proximity of a variable resistance layer 124 according to a third example of the embodiment.

In the third example shown in FIG. 4C, the variable resistance layer 124 is formed in contact with the upper surface of the electrode layer 123. Moreover, in the third example, the memory layer 12 includes a barrier metal layer 126 configured in contact with the lower surface of the electrode layer 125 and in contact with an upper surface of the variable resistance layer 124. The variable resistance layer 124 and the barrier metal layer 126 are configured by similar materials to in the first example and the second example, respectively.

Figure 4D:
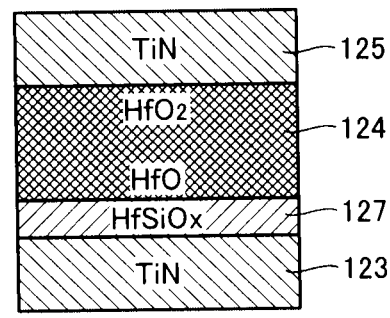
FIG. 4D is a cross-sectional view showing a specific structure in a proximity of a variable resistance layer 124 according to a fourth example of the embodiment.

In the fourth example shown in FIG. 4D, the variable resistance layer 124 is formed in contact with the lower surface of the electrode layer 125. Moreover, in the fourth example, the memory layer 12 includes a buffer layer 127 configured in contact with the upper surface of the electrode layer 123 and in contact with the lower surface of the variable resistance layer 124. The buffer layer 127 functions to absorb oxygen included in the variable resistance layer 124 or to emit oxygen, according to a voltage applied in the Z direction. Immediately after formation, the buffer layer 127 is configured by silicon oxide (SiO$_x$). The buffer layer 127 then absorbs hafnium (Hf) included in the variable resistance layer 124 to become HfSiO$_x$. In addition, the buffer layer 127 may be configured by any of AlO$_x$, AlN, or SiN in place of SiO$_x$. The variable resistance layer 124 is configured by a similar material to in the first example.

The above-described buffer layer 127 suppresses variation in resistance value among a plurality of variable resistance layers 124. Therefore, yield of a memory layer 12 including the buffer layer 127 is higher than yield of a memory layer 12 not including the buffer layer 127. Furthermore, yield of a memory layer 12 including a buffer layer 127 configured by AlO$_x$ is higher than yield of a memory layer 12 including a buffer layer 127 configured by SiO$_x$.

In addition, the number of times that a write operation and a read operation are executable (maximum cycle number) in a memory cell MC comprising a memory layer 12 including the above-described buffer layer 127 is greater than the maximum cycle number in a memory cell MC comprising a memory layer 12 not including the buffer layer 127. Furthermore, the maximum cycle number in a memory cell MC comprising a memory layer 12 including a buffer layer 127 configured by AlO$_x$ is greater than the maximum cycle number in a memory cell MC comprising a memory layer 12 including a buffer layer 127 configured by SiO$_x$. In addition, the buffer layer 127 allows a state where oxygen ions have moved due to voltage application to be retained, hence memory retention characteristics of the memory cell MC are improved.

Figure 4E:
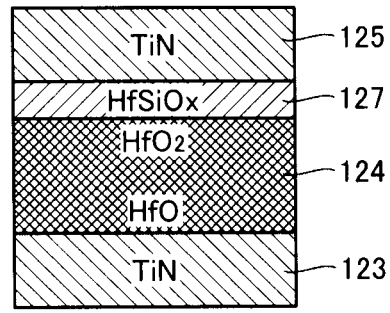
FIG. 4E is a cross-sectional view showing a specific structure in a proximity of a variable resistance layer 124 according to a fifth example of the embodiment.

In the fifth example shown in FIG. 4E, the variable resistance layer 124 is formed in contact with the upper surface of the electrode layer 123. Moreover, in the fifth example, the memory layer 12 includes a buffer layer 127 configured in contact with the lower surface of the electrode layer 125 and in contact with the upper surface of the variable resistance layer 124. The variable resistance layer 124 and the buffer layer 127 are configured by similar materials to in the first example and the fourth example, respectively.

Figure 4F:
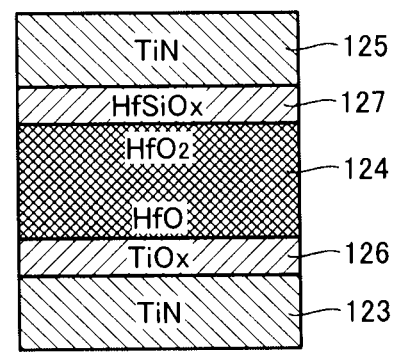
FIG. 4F is a cross-sectional view showing a specific structure in a proximity of a variable resistance layer 124 according to a sixth example of the embodiment.

In the sixth example shown in FIG. 4F, the memory layer 12 includes the above-mentioned barrier metal layer 126 and buffer layer 127 along with the variable resistance layer 124. The barrier metal layer 126 is formed in contact with the upper surface of the electrode layer 123. The variable resistance layer 124 is formed in contact with the upper surface of the barrier metal layer 126 and in contact with the lower surface of the buffer layer 127. The variable resistance layer 124, the barrier metal layer 126, and the buffer layer 127 are configured by similar materials to in the first example, the second example, and the fourth example, respectively.

Figure 4G:
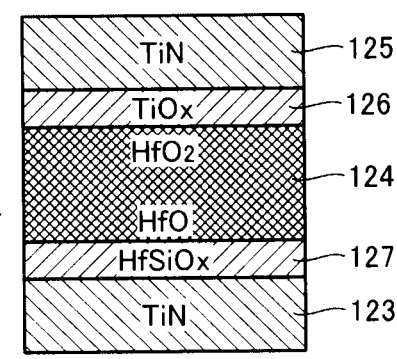
FIG. 4G is a cross-sectional view showing a specific structure in a proximity of a variable resistance layer 124 according to a seventh example of the embodiment.

In the seventh example shown in FIG. 4G, the memory layer 12 includes the above-mentioned barrier metal layer 126 and buffer layer 127 along with the variable resistance layer 124, similarly to in the sixth example. The buffer layer 127 is formed in contact with the upper surface of the electrode layer 123. The variable resistance layer 124 is formed in contact with the upper surface of the buffer layer 127 and in contact with the lower surface of the barrier metal layer 126. The variable resistance layer 124, the barrier metal layer 126, and the buffer layer 127 are configured by similar materials to in the first example, the second example, and the fourth example, respectively.

Figure 5A:
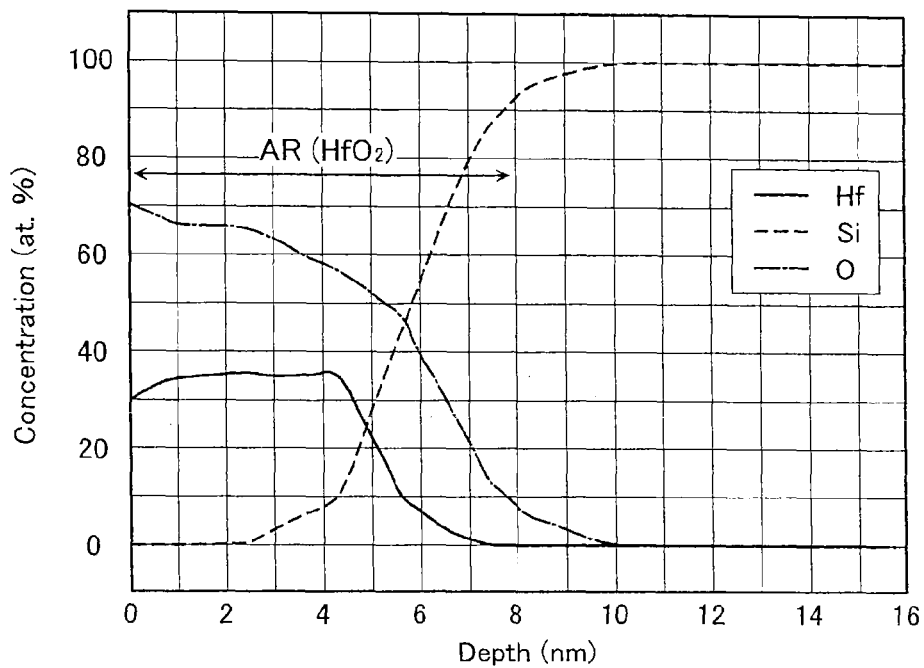
FIG. 5A is a view showing a specific concentration distribution of a variable resistance layer 124C according to a comparative example.
Figure 5B:
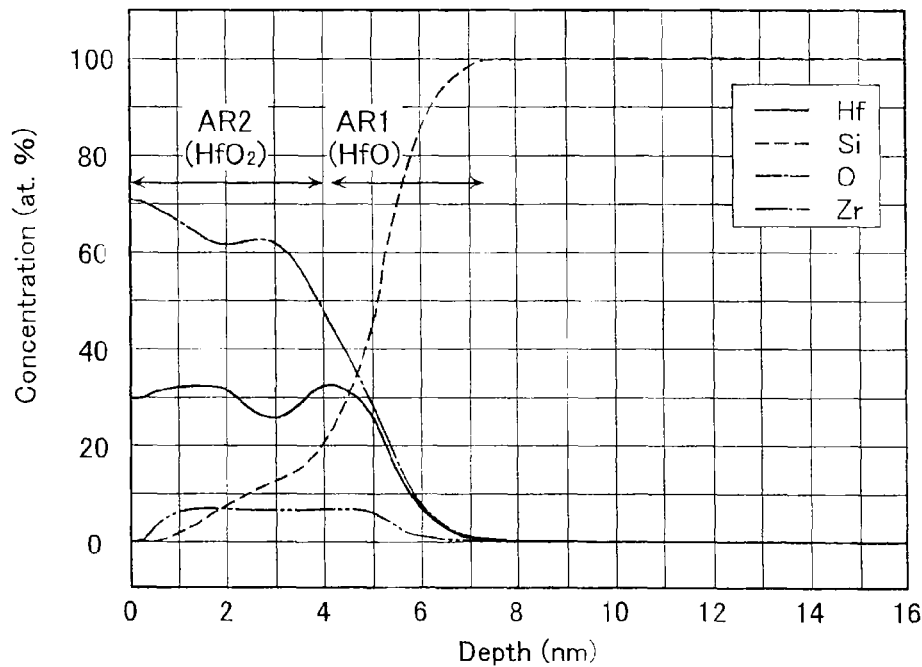
FIG. 5B is a view showing a specific concentration distribution of the variable resistance layer 124.

Next, specific concentration distributions of a variable resistance layer 124C according to a comparative example and of the variable resistance layer 124 according to the above-described first example are described with reference to FIGS. 5A and 5B. Now, compared to the first example, the variable resistance layer 124C according to the comparative example has a ratio of transition metal and oxygen that does not vary along the depth direction and is substantially 1:2 ($HfO_2$). FIGS. 5A and 5B show the concentration distribution in the depth direction of hafnium (Hf) and oxygen (O) deposited on the silicon substrate (Si) for the comparative example and an example, respectively.

As shown in region AR of FIG. 5A, the ratio of hafnium concentration and oxygen concentration in the comparative example is substantially constant (1:2) along the depth direction. On the other hand, as shown in FIG. 5B, the ratio of oxygen concentration and hafnium concentration varies between 1:1 and 1:2 along the depth direction.

Next, manufacturing processes for forming the electrode layer 123, the variable resistance layer 124, and the electrode layer 125 according to the first example shown in FIG. 5B are described. First, the electrode layer 123 is formed by sputtering using TiN (for example, Ti:N=1:1, 250° C.). Next, the variable resistance layer 124 is formed by any of first through third methods of manufacturing. In the first method of manufacturing, hafnium metal is deposited by sputtering. Subsequently, in the first method of manufacturing, a surface of the hafnium metal is oxidized by plasma annealing (PA: Plasma Annealing). This first method of manufacturing causes an upper portion (surface) of the hafnium metal to become $HfO_2$, and on the other hand causes a lower portion of the hafnium metal to become oxygen-deficient HfO. That is, the variable resistance layer 124 is formed. In the second method of manufacturing, substrate temperature is set to 200° C., and sputtering using a hafnium oxide target is executed in an oxygen-free atmosphere. Subsequently, in the second method of manufacturing, a surface of deposited hafnium oxide is oxidized by PA, whereby the variable resistance layer 124 is formed. In the third method of manufacturing, substrate temperature is set to 200° C., and sputtering using a hafnium oxide target is first executed in an oxygen-free atmosphere. Subsequently, in the third method of manufacturing, sputtering using a hafnium oxide target is executed in an oxygen atmosphere, whereby the variable resistance layer 124 is formed. Next, subsequent to the first through third methods of manufacturing, the variable resistance layer 124 is annealed in a nitrogen atmosphere for 30 minutes at 600° C. Then, the electrode layer 125 is formed by sputtering using TiN (for example, Ti:N=1:1, 250° C.).

Moreover, when forming the buffer layer 127, subsequent to formation of the variable resistance layer 124 and prior to formation of the electrode layer 125, aluminum metal is deposited and then annealing is executed at 300° C. in an oxygen atmosphere. Alternatively, subsequent to formation of the variable resistance layer 124 and prior to formation of the electrode layer 125, substrate temperature is set to 250° C., and AlOx is deposited by atomic layer deposition (ALD: Atomic Layer Deposition). Then, ozone is introduced to the AlOx, or the AlOx is exposed to oxygen plasma. The buffer layer 127 is thereby formed.

Next, various kinds of operation parameters in first through third comparative examples, and first and second examples are described with reference to FIGS. 6A-6D. The memory layer 12 according to the first comparative example includes the variable resistance layer 124C in which the ratio of oxygen concentration to transition metal is substantially constant, and does not include buffer layers 127A, 127B. The memory layer 12 according to the second comparative example includes the variable resistance layer 124C and the buffer layer 127A configured by $AlO_x$. The memory layer 12 according to the third comparative example includes the variable resistance layer 124C and the buffer layer 127B configured by $SiO_x$. The memory layer 12 according to the first example includes the variable resistance layer 124 in which the ratio of oxygen concentration to transition metal varies greatly along the depth direction, and does not include the buffer layers 127A, 127B. The memory layer 12 according to the second example includes the variable resistance layer 124, and includes either of the buffer layers 127A ($AlO_x$), 127B ($SiO_x$). Note that in FIGS. 6A-6D, the second example including the buffer layer 127A is assumed to be second example A, and the second example including the buffer layer 127B is assumed to be second example B. Moreover, in FIGS. 6C and 6D, "250 nm TEG" indicates a measurement value of current flowing in a variable resistance layer 124, 124C having a thickness of 250 nm, and "Normalized to 43 nm" indicates a value of current flowing in a variable resistance layer 124, 124C having a thickness of 43 nm estimated on the basis of the "250 nm TEG" measurement result.

Figure 6A:
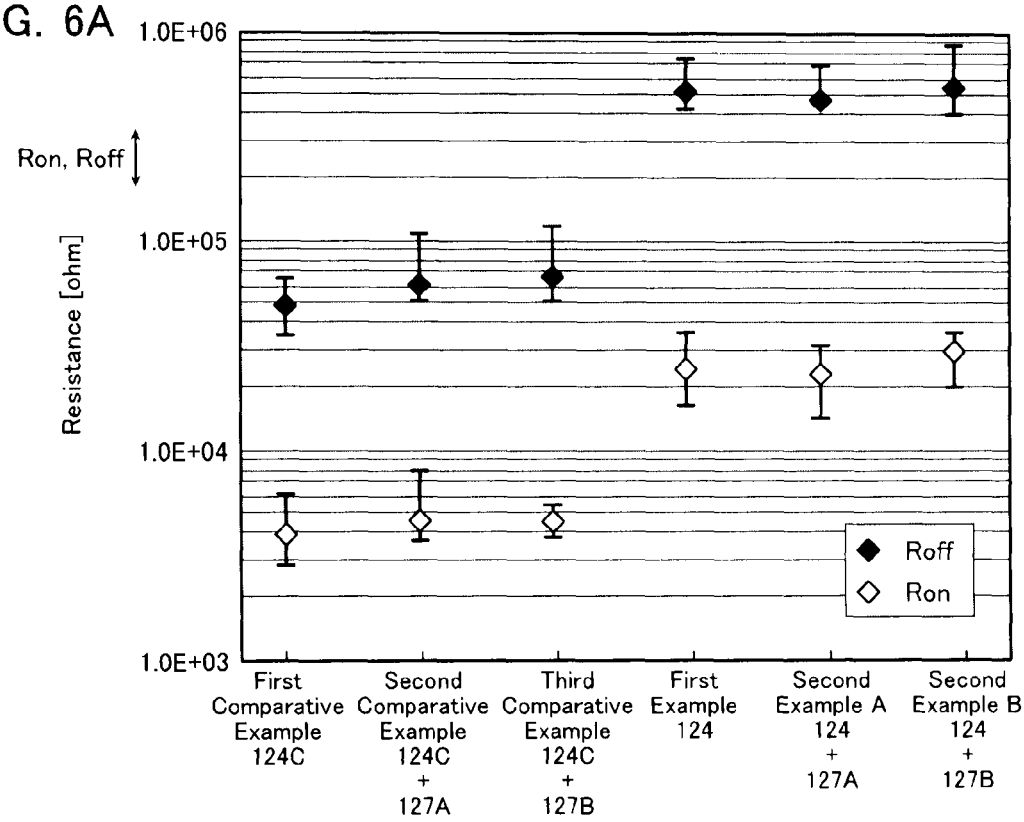
FIG. 6A is a view showing a resistance value Ron of a variable resistance element R in a write state and a resistance value Roff of a variable resistance element R in an erase state for first through third comparative examples, the first example, and second examples A and B.

FIG. 6A shows a resistance value Ron of a variable resistance element R in a write state and a resistance value Roff of a variable resistance element R in an erase state. As shown in FIG. 6A, the difference between the resistance value Ron and the resistance value Roff in the first example and second examples A and B is larger than the difference between the resistance value Ron and the resistance value Roff in the first through third comparative examples. Hence, a larger operational margin can be secured for the first example and second examples A and B than for the first through third comparative examples. That is, the first example and second examples A and B allow occurrence of incorrect write to be suppressed.

Figure 6B:
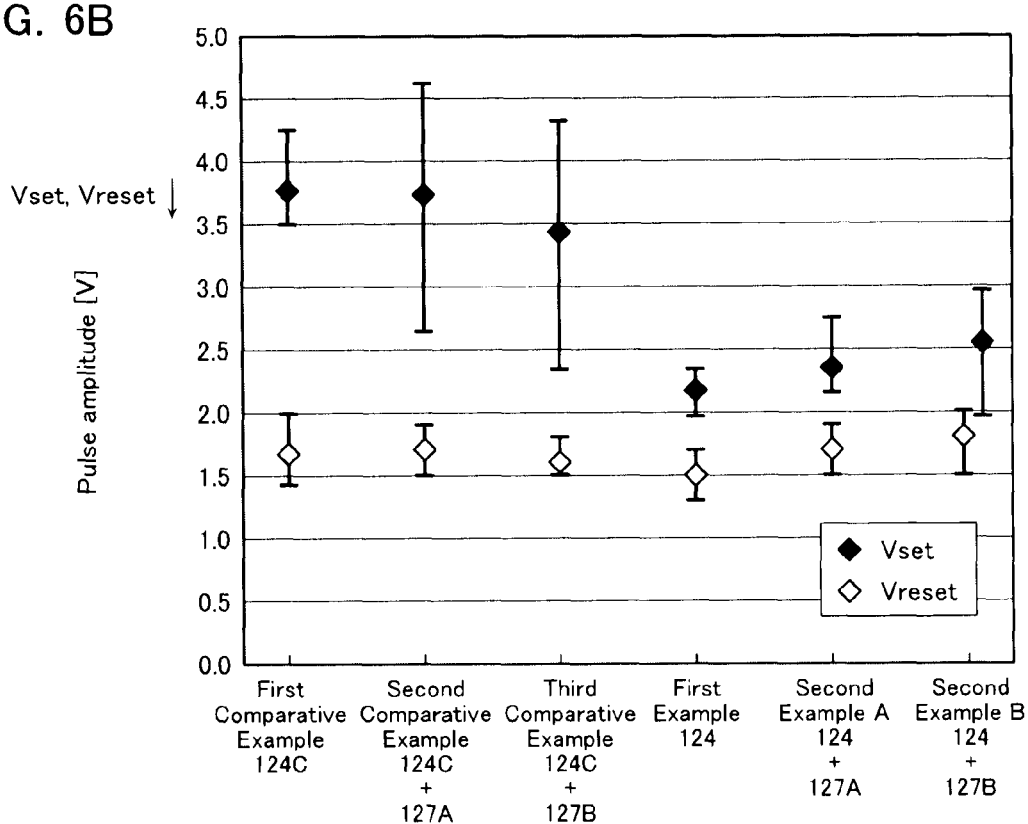
FIG. 6B is a view showing a voltage Vset required in a write operation and a voltage Vreset required in an erase operation on a variable resistance element R for first through third comparative examples, the first example, and second examples A and B.

FIG. 6B shows a voltage Vset required in a write operation on a variable resistance element R and a voltage Vreset required in an erase operation on a variable resistance element R. As shown in FIG. 6B, the voltage Vset and the voltage Vreset in the first example and second examples A and B are both smaller than the voltage Vset and the voltage Vreset in the first through third comparative examples.

Figure 6C:
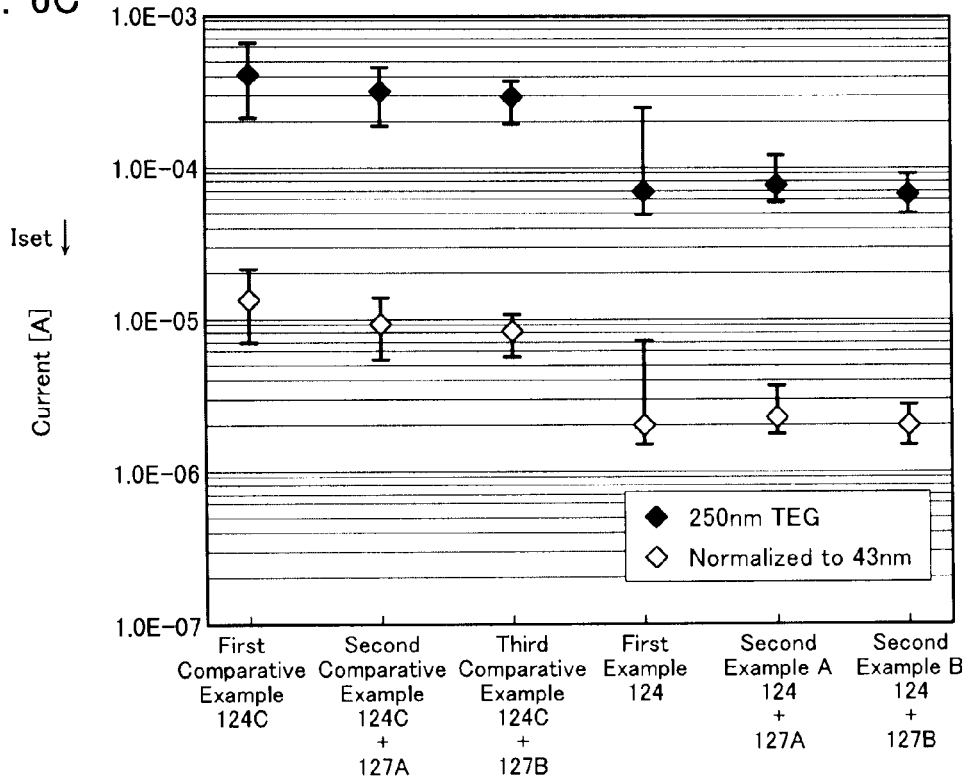
FIG. 6C is a view showing a current Iset required in a write operation on a variable resistance element for first through third comparative examples, the first example, and second examples A and B.

FIG. 6C shows a current Iset required in a write operation on a variable resistance element R. As shown in FIG. 6C, the current Iset in the first example and second examples A and B is smaller than the current Iset in the first through third comparative examples.

Figure 6D:
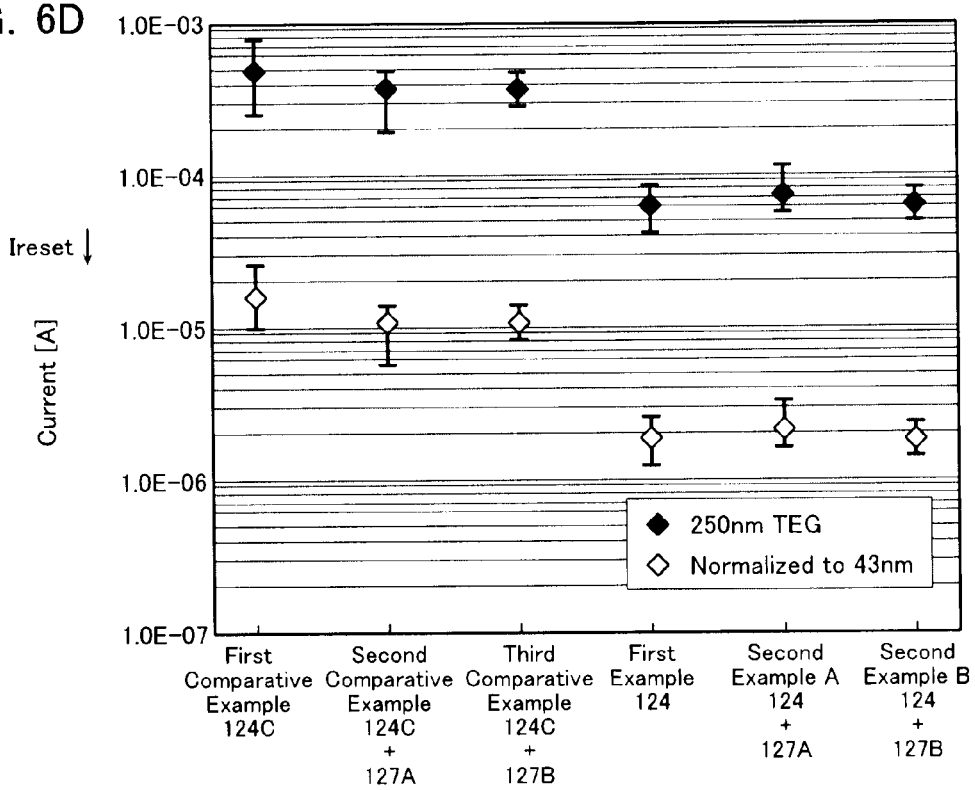
FIG. 6D is a view showing a current Ireset required in an erase operation on a variable resistance element R for first through third comparative examples, the first example, and second examples A and B.

FIG. 6D shows a current Ireset required in an erase operation on a variable resistance element R. As shown in FIG. 6D, the current Ireset in the examples is smaller than in the comparative examples. As shown above in FIGS. 6B-6D, the voltage Vset, Vreset and the current Iset, Ireset in the first example and second examples A and B are all smaller than those in the first through third comparative examples. That is, the first example and second examples A and B allow power consumption to be suppressed lower than the first through third comparative examples.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, shown in FIG. 5B, the variable resistance layer 124 may include silicon, and a ratio of silicon to the transition metal oxide (HfO, HfO$_2$) configuring the variable resistance layer 124 may monotonically decrease along the Z direction with decreasing of a ratio of transition metal (Hf) to oxygen (O).

What is claimed is:

1. A semiconductor memory device comprising memory cells, each of the memory cells comprising a variable resistance element and a switching element connected in series,
    the variable resistance element comprising a variable resistance layer configured to change in resistance value thereof between a first-resistance state and a second-resistance state having a resistance value higher than that of the first-resistance state, and a buffer layer formed in contact with one end of the variable resistance layer,
    the variable resistance layer including a transition metal oxide,
    a ratio of transition metal and oxygen of the transition metal oxide varying between 1:1 and 1:2 along a first direction directed from a first region having said ratio of 1:2 to a second region having said ratio of 1:1,
    a concentration of the transition metal along the first direction and a concentration of the oxygen along the first direction decrease in said second region where the ratio of transition metal and oxygen of the transition metal oxide is 1:1,
    wherein
    the variable resistance layer includes silicon,
    a ratio of silicon to the transition metal oxide configuring the variable resistance layer monotonically increases along the first direction.

2. The semiconductor memory device according to claim 1, wherein
    the buffer layer is formed in contact with said one end of the variable resistance layer and configured to absorb oxygen included in the variable resistance layer according to a voltage applied along the second direction.

3. The semiconductor memory device according to claim 1, wherein
    the transition metal oxide includes hafnium.

4. The semiconductor memory device according to claim 2, wherein
    the buffer layer includes a transition metal.

5. The semiconductor memory device according to claim 2, wherein
    the buffer layer includes any one of SiO$_x$, AlO$_x$, SiN, and AlN.

6. The semiconductor memory device according to claim 1, further comprising:
    a first electrode layer in electrical contact with said one end of the variable resistance layer; and
    a second electrode layer in electrical contact with the other end of the variable resistance layer,
    wherein the first electrode layer and the second electrode layer include a metal or a metal nitride.

7. The semiconductor memory device according to claim 2, further comprising:
    a first electrode layer in electrical contact with said one end of the variable resistance layer such that the buffer layer is sandwiched between the first electrode layer and the variable resistance layer; and
    a second electrode layer in electrical contact with the other end of the variable resistance layer,
    wherein the first electrode layer and the second electrode layer include a metal or a metal nitride.

8. The semiconductor memory device according to claim 1, wherein
    the variable resistance element further comprises a barrier metal layer formed in contact with the other end of the variable resistance layer and configured to control diffusion of atoms included in the variable resistance layer.

9. The semiconductor memory device according to claim 8, wherein
    the barrier metal layer includes a metal oxide.

10. The semiconductor memory device according to claim 8, wherein
    the barrier metal layer includes titanium oxide.

11. The semiconductor memory device according to claim 8, further comprising:
    a first electrode layer in electrical contact with said one end of the variable resistance layer such that the barrier metal layer is sandwiched between the first electrode layer and the variable resistance layer; and
    a second electrode layer in electrical contact with the other end of the variable resistance layer,
    wherein the first electrode layer and the second electrode layer include a metal or a metal nitride.

12. The semiconductor memory device according to claim 1, wherein
    the buffer layer is in contact with said one end of the variable resistance layer and configured to absorb oxygen included in the variable resistance layer according to a voltage applied along the first direction,
    and wherein the variable resistance element further comprises a barrier metal layer in contact with the other end of the variable resistance layer and configured to control diffusion of atoms included in the variable resistance layer.

13. The semiconductor memory device according to claim 12, wherein
    the buffer layer includes a transition metal.

14. The semiconductor memory device according to claim 12, wherein
    the buffer layer includes any one of SiO$_x$, AlO$_x$, SiN, and AlN.

15. The semiconductor memory device according to claim 12, wherein
    the barrier metal layer includes a metal oxide.

16. The semiconductor memory device according to claim 12, further comprising:
    a first electrode layer in electrical contact with said one end of the variable resistance layer such that the buffer layer is sandwiched between the first electrode layer and the variable resistance layer; and a second electrode layer in electrical contact with the other end of the variable resistance layer such that the barrier metal layer is sandwiched between the second electrode layer and the variable resistance layer, wherein the first electrode layer and the second electrode layer include a metal or a metal nitride.

17. The semiconductor memory device according to claim 1, wherein the switching element is a bipolar type element configured capable of allowing a current to flow bi-directionally in the memory cell according to a polarity of a voltage applied to the memory cell.

18. The semiconductor memory device according to claim 1, wherein the concentration of the transition metal in the first region varies less than the concentration of the transition metal in the second region.

19. The semiconductor memory device according to claim 1, wherein a thickness of the variable resistance layer is not more than 10 nm.

\* \* \* \* \*